(12) United States Patent
Tran

(10) Patent No.: US 6,515,896 B1
(45) Date of Patent: Feb. 4, 2003

(54) MEMORY DEVICE WITH SHORT READ TIME

(75) Inventor: Lung T. Tran, Saratoga, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/910,823

(22) Filed: Jul. 24, 2001

(51) Int. Cl.⁷ .............................................. G11C 11/14
(52) U.S. Cl. ...................................... 365/171; 365/173
(58) Field of Search .............................. 365/171, 158, 365/173, 182, 218, 205, 230.03

(56) References Cited

U.S. PATENT DOCUMENTS

| | | | | |
|---|---|---|---|---|
| 4,061,999 A | * | 12/1977 | Proebsting et al. | 365/182 |
| 5,477,482 A | | 12/1995 | Prinz | 365/129 |
| 5,748,519 A | | 5/1998 | Tehrani et al. | 365/98 |
| 5,784,327 A | * | 7/1998 | Hazani | 365/218 |
| 5,793,697 A | | 8/1998 | Scheuerlein | 365/230.07 |
| 5,852,574 A | | 12/1998 | Naji | 365/158 |
| 5,930,189 A | * | 7/1999 | Matsubara | 365/205 |
| 5,936,982 A | | 8/1999 | Dunn | 365/158 |
| 5,946,227 A | * | 8/1999 | Naji | 365/158 |
| 5,969,978 A | | 10/1999 | Prinz | 365/98 |
| 5,986,925 A | | 11/1999 | Naji et al. | 365/158 |
| 6,055,178 A | | 4/2000 | Naji | 365/158 |
| 6,111,781 A | * | 8/2000 | Naji | 365/158 |
| 6,128,239 A | | 10/2000 | Perner | 365/209 |
| 6,134,138 A | | 10/2000 | Lu et al. | 365/158 |
| 6,185,143 B1 | | 2/2001 | Perner et al. | 365/210 |
| 6,188,615 B1 | | 2/2001 | Perner et al. | 365/189.01 |
| 6,219,273 B1 | * | 4/2001 | Katti et al. | 365/158 |
| 6,349,054 B1 | * | 2/2002 | Hidaka | 365/173 |
| 2002/0006058 A1 | * | 1/2002 | Nakajima et al. | |
| 2002/0034117 A1 | * | 3/2002 | Okazawa | |

* cited by examiner

Primary Examiner—David Nelms
Assistant Examiner—Thinh T. Nguyen

(57) ABSTRACT

The memory device includes a memory array of memory cells, and intersecting word lines and bit lines. At one end of the array, a bank of read/write select switches selectively couples the bit lines to a column write current source, and to a reference potential voltage. A bank of sense amplifier select switches selectively couples the bit lines to a sense amplifier, which is also at the reference potential voltage. Each switch in the bank of sense amplifier select switches may be closed to allow the sense amplifier to sense the binary state of a selected memory cell. The switches in the bank of read/write select switches may each be closed to couple a selected bit line to reference potential voltage. During read operations, the bank of sense amplifier select switches and the bank of read write select switches are operated so that ends of the bit lines are coupled to the reference potential voltage, so that the memory array remains in an equipotential state. Because the memory array remains in the equipotential state, no settling time is required for the memory array due to multiplexing to the sense amplifier. Read operations are therefore faster than in conventional devices.

21 Claims, 5 Drawing Sheets

MEMORY DEVICE WITH SHORT READ TIME

TECHNICAL FIELD

The technical field is resistive cross point memory devices. More specifically, the technical field is memory devices having short read times.

BACKGROUND

Magnetic Random Access Memory ("MRAM") is a proposed type of non-volatile memory. Accessing data from MRAM devices is much faster than accessing data from conventional long term storage devices such as hard drives. Additionally, MRAM is compact and consumes less power than conventional long term storage devices.

FIG. 1 illustrates a conventional MRAM memory array 10 having resistive memory cells 12 located at cross points of word lines 14 and bit lines 16. The word lines 14 extend horizontally along rows of the memory array 10, and the bit lines 16 extend vertically along columns of the memory array 10. Each memory cell 12 is capable of storing the binary states of "1" and "0."

FIG. 2 illustrates a conventional memory cell 12. The memory cell 12 is a spin dependent tunneling ("SDT") device. The memory cell 12 includes a pinned layer 24 and a free layer 18. The pinned layer 24 has a magnetization that has a fixed orientation, illustrated by the arrow 26. The magnetization of the free layer 18, illustrated by the bidirectional arrow 28, can be oriented in either of two directions along an "easy axis" of the free layer 18. If the magnetizations of the free layer 18 and the pinned layer 24 are in the same direction, the orientation of the memory cell 12 is "parallel." If the magnetizations are in opposite directions, the orientation is "anti-parallel." The two orientations correspond to the binary states of "1" and "0," respectively.

The free layer 18 and the pinned layer 24 are separated by an insulating tunnel barrier layer 20. The insulating tunnel barrier layer 20 allows quantum mechanical tunneling to occur between the free layer 18 and the pinned layer 24. The tunneling is electron spin dependent, making the resistance of the memory cell 12 a function of the relative orientations of the magnetizations of the free layer 18 and the pinned layer 24. The resistance of the memory cell 12 has a "low" value of R if the orientation is parallel, and a "high" value of R+$\Delta$R if the orientation is anti-parallel.

Each memory cell 12 in the memory array 10 can have its binary state changed by a write operation. Write currents supplied to the word line 14 and the bit line 16 crossing at a specific memory cell 12 switch the magnetization of the free layer 18 between parallel and anti-parallel with the pinned layer 24. A current Iy passing through the bit line 16 results in the magnetic field Hx. A similar magnetic field Hy is created when a current Ix passes through the word line 14. The magnetic fields Hx and Hy combine to switch the magnetic orientation of the memory cell 12. The change in resistance due to the changing memory cell magnetization is readable to determine the binary state of the memory cell 12.

Each of the bit lines 16 in the memory array 10 is connected to a switch (not shown), and each switch is connected to an input of a sense amplifier (not shown). The binary state, or "bit," of a selected memory cell 12 is read by applying a read voltage to the word line 14 of a particular memory cell 12 while the bit line 16 crossing the memory cell 12 is connected to the input of the sense amplifier. The switch connecting the selected bit line 16 to the sense amplifier is alternately opened and closed to read the selected memory cell 12.

The read operation in the conventional memory array 10 is slowed by the requirement for the memory array 10 to "settle" between reading memory cells 12. The memory array 10 must settle because each time a switch connecting a selected bit line 16 to the sense amplifier is opened or closed, the potential at the end of the bit line 16 changes. The change in potential at the end of the bit line causes the voltage across the memory cells 12 to change to a different equilibrium state. The microprocessor controlling the read operation must therefore incorporate a settling time into the read operation to allow the memory array 10 to settle to the desired equilibrium state between reading of memory cells 12. A settling time is undesirable because fewer memory cells 12 can be read per unit time.

A need therefore exists to decrease the read time in memory arrays.

SUMMARY

According to a first aspect, a memory device achieves a reduced read time. The memory device includes a memory array of memory cells, and intersecting word lines and bit lines. A bank of sense amplifier select switches selectively couples the bit lines to a sense amplifier. Each switch in the bank of sense amplifier select switches may be closed to allow the sense amplifier to sense the binary state of a selected memory cell. A bank of read/write select switches selectively couples the bit lines to a column write current source, and to a reference potential voltage. The switches in the bank of read/write select switches may each be closed to couple a selected bit line to the reference potential voltage. During read operations, the bank of sense amplifier select switches and the bank of read/write select switches are operated so that the bit lines in the memory array remain in an equipotential state.

According to the first aspect, the array is not disturbed by the connection and disconnection of bit lines with the sense amplifier. The sense amplifier, which is set at the reference potential voltage, provides the same potential to the bit lines as the bank of read/write switches. Because the bit lines in the memory array are not disturbed from the equipotential state, a settling time due to switching to the amplifier is not required. Read times are therefore shorter than in conventional devices.

Other aspects and advantages will become apparent from the following detailed description, taken in conjunction with the accompanying drawings.

DETAILED DESCRIPTION

A memory device 50 will be discussed by way of preferred embodiments and by way of the drawings.

Figure 1:
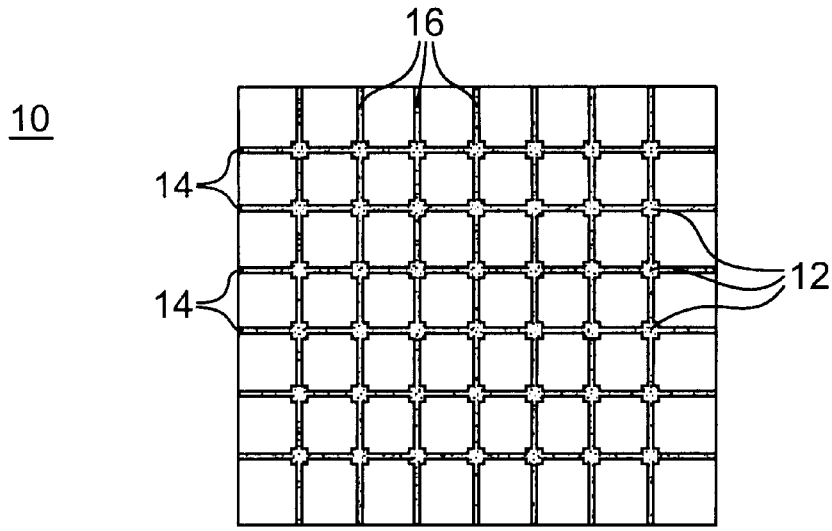
FIG. 1 illustrates a conventional memory cell array.
Figure 2:
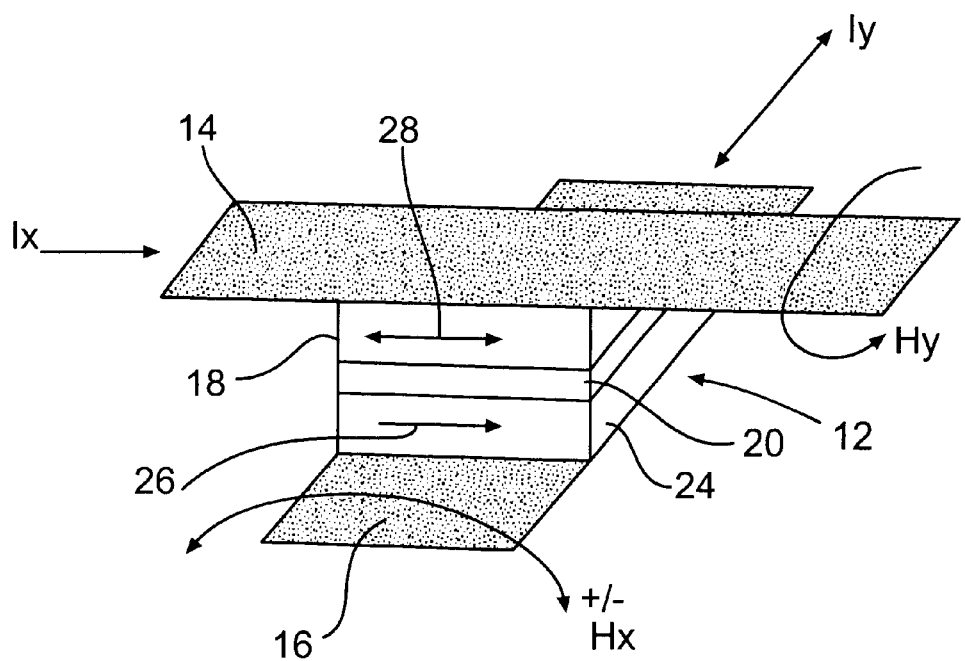
FIG. 2 illustrates binary states of a conventional memory cell.
Figure 3:
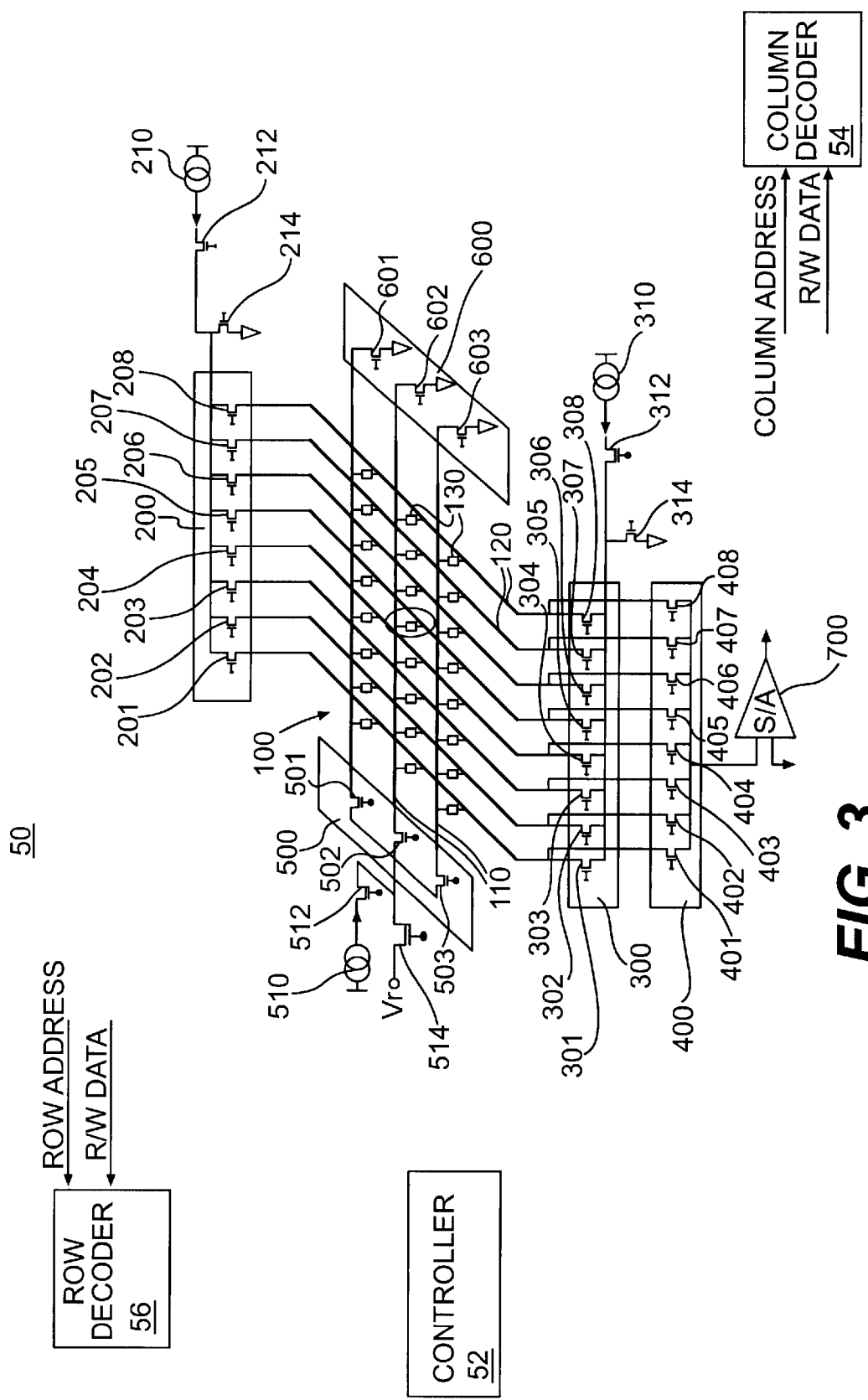
FIG. 3 is a schematic view of an embodiment of a memory device.

FIG. 3 is a schematic view of the memory device 50. The memory device 50 includes a controller 52, a column decoder 54, a row decoder 56, a memory array 100, a bank 200 of write select switches, a bank 300 of read/write select switches, a bank 400 of sense amplifier select switches, a bank 500 of read/write select switches, a bank 600 of write termination select switches, and a sense amplifier 700.

The controller 52 controls read and write operations of the memory device 50 through the row decoder 56 and the column decoder 54. The controller 52 is coupled to the row decoder 56 to transmit commands to the row decoder 56, including read/write (R/W) data and address data. The row decoder 56 is coupled to the gates of the switches in the switch banks 500 and 600, and opens and closes the switches in accordance with the controller 52 instructions. Similarly, the controller 52 is coupled to the column decoder 54, which is coupled to the gates of the switches in the switch banks 200, 300, 400. The switches utilized in the memory device 50 are illustrated as transistors. However, switches such as, for example, FET or MOSFET switches, and other switches, can also be used.

The memory array 100 stores data for the memory device 50. In the memory array 100, word lines 110 extend in horizontal rows, and bit lines 120 extend in vertical columns. The word lines 110 cross the bit lines 120 at memory cells 130. Each memory cell 130 can store a binary state of either "1" or "0." In FIG. 3, three rows of word lines 110 and eight columns of bit lines 120, intersecting at twenty-four memory cells 130, are shown for the purposes of illustration. In practice, arrays of 1024×1024 memory cells and larger, for example, may be used. In FIG. 3, an exemplary memory cell 130 is indicated by an oval around the memory cell 130. This memory cell 130 is at the intersection of the word line 110 in the second row and the bit line 120 in the fifth column.

In order to write to any memory cell 130 in the memory array 100, a column write current is supplied to the bit line 120 of the column in which the memory cell 130 is located, and a row write current is supplied to the word line 110 of the row in which the memory cell 130 is located. The magnetic fields generated by the write currents in the word and bit lines combine to change the binary state of the memory cell 130 from "0" to "1," and vice versa.

The bank 200 of write select switches includes write select switches 201, 202, 203, 204, 205, 206, 207, 208. Each write select switch is coupled to a bit line 120 of the memory array 100. The bank 200 of write select switches allows a column write current to be applied to a selected bit line 120. The column write current is generated by a column write current source 210. A switch 212 selectively couples the column write current source 210 to the bank 200 of write select switches. A switch 214 selectively couples the bank 200 of write select switches to ground.

The bank 300 of read/write select switches includes read/write select switches 301, 302, 303, 304, 305, 306, 307, 308. Each read/write select switch is coupled to a bit line 120 of the memory array 100. The bank 300 of read/write select switches allows a column write current to be supplied to a selected bit line 120. The column write current is supplied to the bank 300 of read/write select switches by a column write current source 310. The column write current source 310 is selectively coupled to the bank 300 of read/write select switches through a switch 312. The bank 300 of read/write select switches is selectively coupled to a reference potential voltage through a switch 314. In the embodiment illustrated in FIG. 3, a reference potential voltage of ground is used. Other reference potential voltages, however, may be used.

The bank 400 of sense amplifier select switches selectively couples the sense amplifier 700 to the bit lines 120 of the memory array 100. The bank 400 of sense amplifier select switches includes switches 401, 402, 403, 404, 405, 406, 407, 408, each switch selectively coupling a corresponding bit line 120 to the sense amplifier 700. The switch bank 400 allows the sense amplifier 700 to detect the binary state of selected memory cells 130.

The bank 500 of read/write select switches includes read/write select switches 501, 502, 503. Each read/write select switch is coupled to a word line 110 of the memory array 100. The bank 500 of read/write select switches is coupled to a row write current source 510 through a switch 512, and to a read voltage Vr through a switch 514. The bank 600 of write termination select switches includes switches 601, 602, 603. The bank 600 of write termination select switches selectively couples each of the word lines 110 to ground. When a row write current is supplied to a selected word line 110, the corresponding switch in the bank 600 of write termination select switches is closed to allow the row write current to flow through the selected word line 110.

Figure 4:
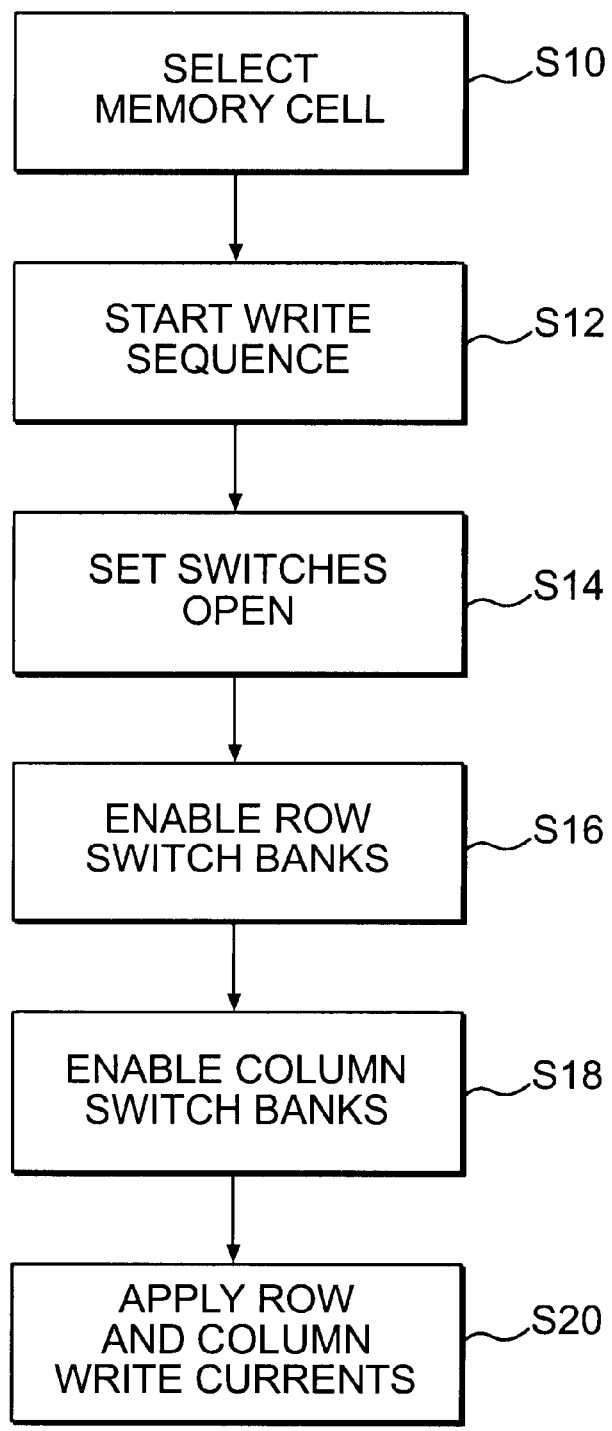
FIG. 4 is a flow chart illustrating a write operation for the memory device illustrated in FIG. 3.

A write operation of the memory device 50 will now be discussed with reference to FIGS. 3 and 4. FIG. 4 is a flow chart illustrating the write operation for the memory device 50.

In step S10, the controller 52 selects the row and the column that intersect at a selected memory cell 130. In step S12, the controller 52 starts a write sequence for the memory device 50. In step S14, the controller 52 sets all switches in the memory device 50 to open.

In step S16, the switch banks 500 and 600 are enabled to supply a row write current to the memory array 100. The switch banks 500 and 600 are enabled by closing the switch 512. Closing the switch 512 allows a row write current to flow through the selected word line 110 once selected switches in the switch banks 500 and 600 are closed.

In step S18, the switch banks 200 and 300 are enabled to supply a column write current to the memory array 100. If the controller 52 is writing a state of "0" to the selected memory cell 130, the switch banks 200, 300 are enabled by closing the switches 212, 314. This configuration allows a column write current to flow from the column write current source 210, through the selected bit line 120, to ground through the switch 314, after selected switches in the switch banks 200 and 300 are closed. Conversely, if a state of "1" is to be written to the selected memory cell 130, the switch banks 200, 300 are enabled by closing the switches 214, 312. This configuration allows a column write current to flow from the column write current source 310, through the selected bit line 120, to ground through the switch 214, after selected switches in the switch banks 200 and 300 are closed.

In step S20, a row write current is applied to the selected word line 110 and a column write current is supplied to the selected bit line 120. The row write current is applied by closing switches in the banks 500 and 600 that correspond to a selected row. For example, if the binary state of the indicated memory cell 130 in the second row and fifth column of the memory array 100 is selected, the switches 502 and 602 are closed, allowing the row write current to flow through the word line 110 in the second column.

The column write current is applied by closing switches in the banks 200 and 300 that correspond to the selected bit line 120. In the above example, the switches 205 and 305 are closed, allowing the column write current to flow through the bit line 120 in the fifth column.

In the memory array 100, the indicated memory cell 130 located at the intersection of the selected row and column has its binary state changed by the write operation. The resultant magnetic field at the selected memory cell 130 located at the intersection of the selected word line 110 and bit line 120 is the sum of the magnetic fields created by the row and column write currents. The resultant magnetic field changes the binary state of the selected memory cell 130.

The row and column write currents should be applied at substantially the same time. The switches in the switch banks are only closed for a short time during application of the row and column write currents. For example, the switches can be closed for a time period on the order of 1–100 nanoseconds.

Figure 5:
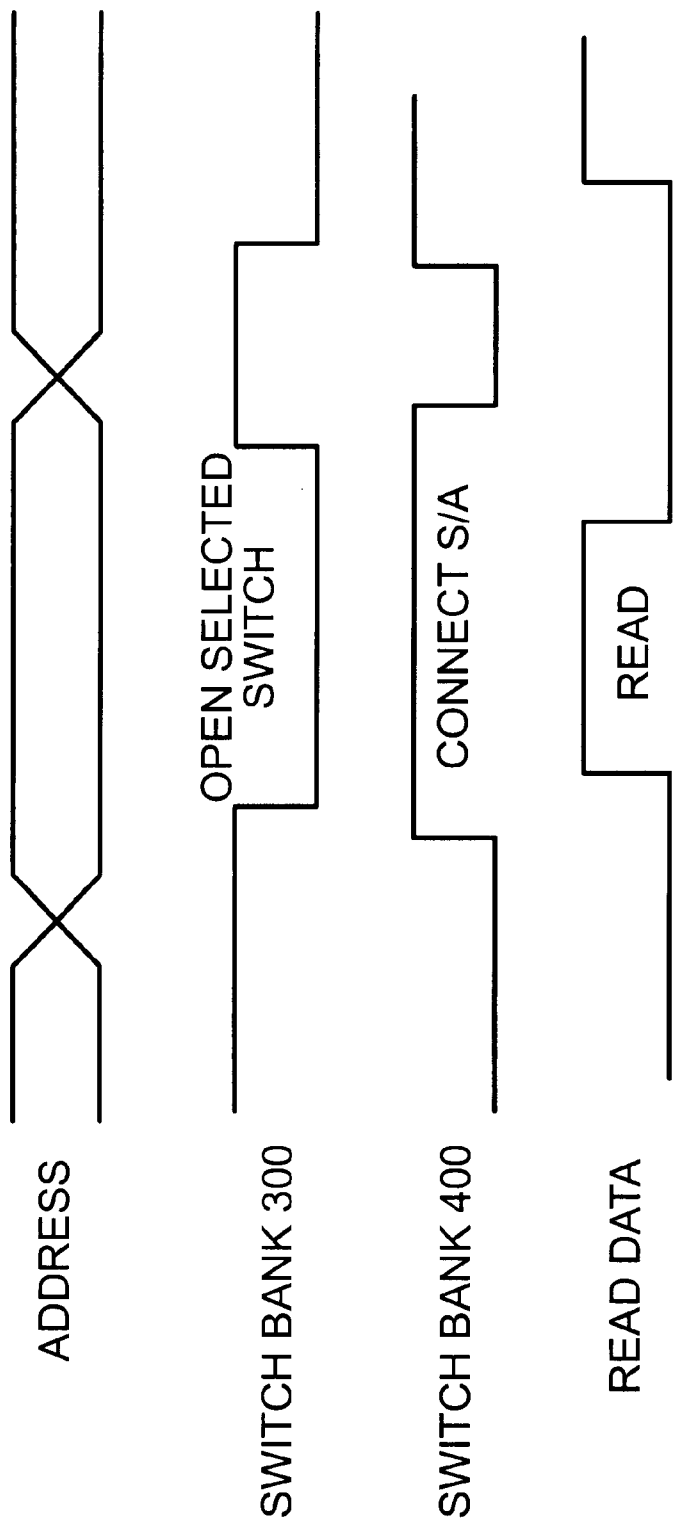
FIG. 5 is a read timing diagram of the memory device illustrated in FIG. 3.
Figure 6:
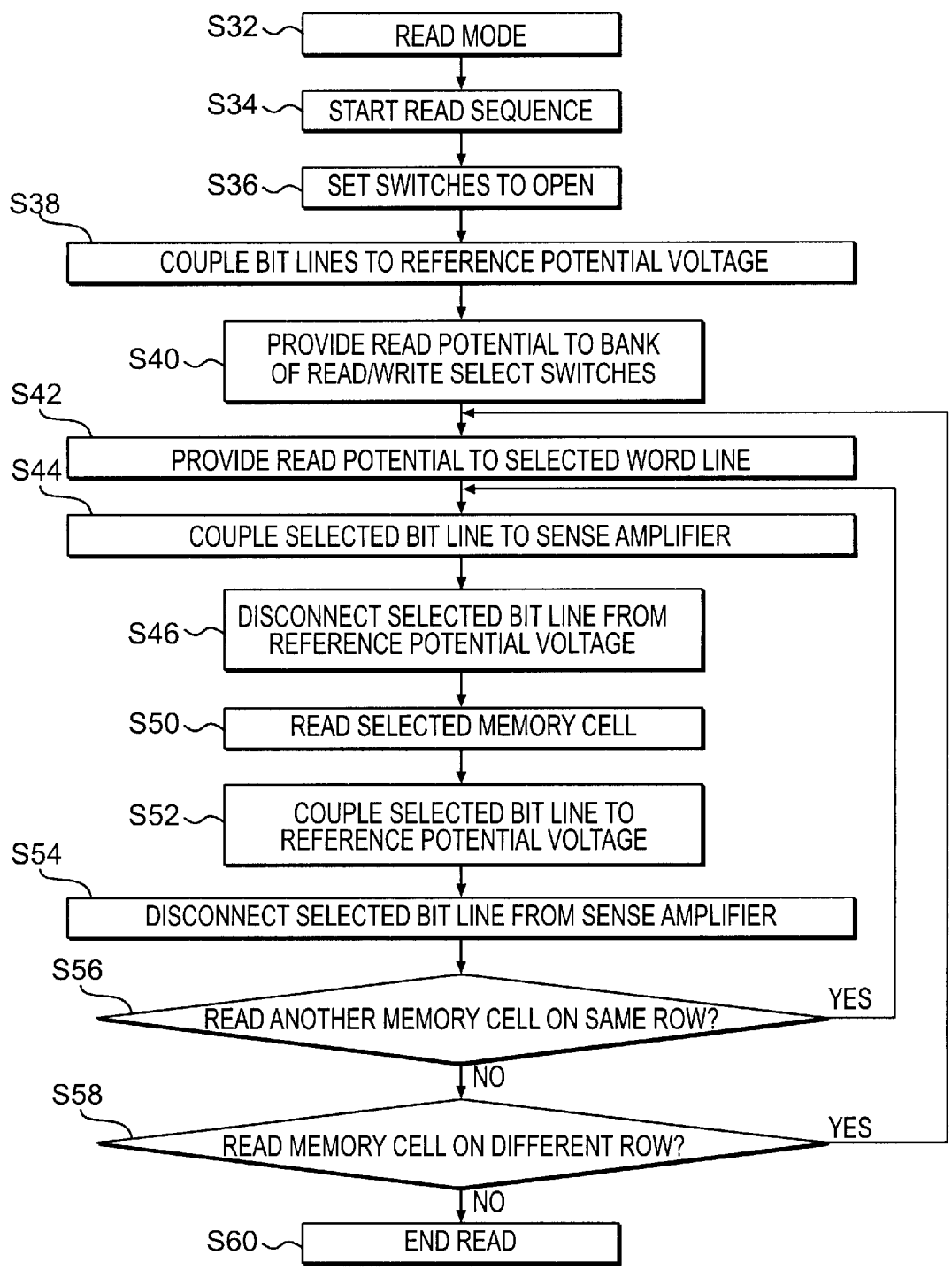
FIG. 6 is a flow chart illustrating a read operation of the memory device illustrated in FIG. 3.

A read operation for the memory device 50 will now be discussed with reference to FIGS. 3, 5 and 6. FIG. 5 is a read timing diagram of the memory device 50, and FIG. 6 is a flow chart illustrating a read operation of the memory device 50.

In step S32, the controller places the memory device in a read mode. At this time, the controller 52 may send the row and column address of a selected memory cell 130 to the row decoder 56 and the column decoder 54. The transmission of the address corresponds to the "ADDRESS" line of the read timing diagram in FIG. 5.

In step S34, the controller starts a read sequence. In step S36, all switches in the memory device 50 are set to open.

In step S38, the bit lines 120 are connected to the reference potential voltage by closing the switches 314 and 301–308. The reference potential voltage may be ground. In FIG. 5, for illustrative purposes, the bank 300 switches are illustrated as closed at the start of the read timing diagram, in the "SWITCH BANK 300" line.

In step S40, the switch 514 is closed to provide a read potential Vr to the bank 500 of read/write select switches.

In step S42, the switch in the switch bank 500 corresponding to the selected row is closed, For example, if the indicated memory cell 130 is to be read, the switch 502 (corresponding to the second row) would be closed. The read potential Vr is thereby applied to the word line 110 in the second row. A time is allowed to pass while the memory array 100 settles. That settling time allows currents in the bit lines 120 to reach the equilibrium state. Referring to FIG. 3, these currents flow from a selected word line 110 through the memory cells 130 in contact with the selected word line 110, through the bit lines 120, the switches in bank 300, and the switch 314.

In step S44, the switch in the switch bank 400 corresponding to the selected column is closed. In the above example, the switch 405 is closed. The remaining switches 410–404, 406–408 remain open. Closing the switch in the switch bank 400 connects the selected column to the sense amplifier 700. This connection is illustrated in the "SWITCH BANK 400" line of the read timing diagram in FIG. 5.

The sense amplifier 700 is at the reference potential voltage. For example, if the switch 314 is connected to a reference potential voltage of ground, the sense amplifier 700 may be at virtual ground. Therefore, the potential to which the selected bit line 120 is coupled does not change when the sense amplifier 700 is connected. The resistance of the flow path for the read current changes minimally when the sense amplifier 700 is connected, because nearly all of the resistance in the path lies in the memory cell 130. Accordingly, there is virtually no disturbance to the memory array 100 when the selected bit line 120 is connected to the sense amplifier 700.

In step S46, the switch in the switch bank 300 corresponding to the selected column is opened, disconnecting the selected bit line 120 from the reference potential voltage at the switch 314. The remaining switches in the switch bank 300 remain closed. In the example, switch 305 is opened.

The switch 305 remains open while the sense amplifier 700 remains connected to the selected bit line through the switch 405. Because the selected bit line 120 remains connected to the sense amplifier 700, the bit line 120 remains connected to the reference potential voltage, and there is minimal disturbance in the memory array 100. The memory array 100 is therefore maintained at its equilibrium potential.

In step S50, the sense amplifier 700 senses the current from the selected bit line 120 to determine the binary state of the selected memory cell 130. The binary state may detected by the controller 52 from the output from the sense amplifier 700. The output of the sense amplifier 700 can indicate the resistance state of the selected memory cell 130. Alternatively, the sense amplifier 700 can include support circuitry to determine the binary state, and to output the binary state to the controller 52. The binary state can be determined as a change in resistance of the selected memory cell 130 due to an increase or a decrease in the current through the selected bit line 120. For example, a high resistance state (anti-parallel state) results in a low current through the memory cell 130, which can represent a binary state of "0." A low resistance state (parallel state) results in a high current through the memory cell 130, and can represent a binary state of "1."

In step S52, the switch in the switch bank 300 corresponding to the selected bit line 120 is closed. Closing this switch couples the selected bit line 120 to the reference potential voltage through the switch 314. In step S54, the switch in the switch bank 400 corresponding to the bit line 120 is opened. Opening this switch disconnects the selected bit line 120 from the sense amplifier 700. At this time, all of the bit lines 120 in the memory array 100 are connected to the reference potential voltage through the switch 314.

During opening and closing of the switches in steps S52 and S54, the potential at the end of the selected bit line 120 remains at the reference potential voltage. The memory array 100 is therefore maintained at its equilibrium potential.

In step S56, the controller 52 determines whether a different memory cell 130 in the selected row is to be read. If yes, the process returns to step S44. If no, in step S58, the controller 52 determines whether a memory cell 130 in a different row is to be read. If yes, the process returns to step S42. If no, the read operation is ended in step S60.

According to the above method of reading a memory array, the settling time of the memory array 100 due to connection and disconnection of a selected bit line 120 to the sense amplifier 700 is eliminated. The settling time is unnecessary because the memory array 100 is maintained at its equilibrium potential throughout read operation. The equilibrium potential is maintained because the bit lines 120 are alternately connected to the same reference potential voltage during connection and disconnection with the sense amplifier 700.

In the above embodiment, the bit lines 120 are connected to ground through the switch banks 300 and 400. This is merely an example of a reference potential voltage, however, and other reference potential voltages can be used.

The sense amplifier 700 is an example of a sensing device for detecting a binary state of a the memory cells 130 in the memory device 50. In practice, other sensing devices, such as a trans-impedance sense amplifier, a charge-injection sense amplifier, a differential sense amplifier, or a digital differential sense amplifier, for example, can be used.

One sense amplifier 700 is illustrated in FIG. 3 for sensing the binary state of the memory cells 130. In practice, a greater number of sensing devices can be coupled to a memory array. For example, a sense amplifier can be included for each bit line in a memory array, or, a sense amplifier can be included for every two or more bit lines in a memory array.

The conventions for current flow to write states of "0" and "1" in the memory array are arbitrary, and can be reassigned to fit any desired application of the memory device 50.

The memory cell 130 used in the memory array 100 can be any type of memory cell responsive to a read and write currents. For example, memory cells such as giant magnetoresistance (GMR) devices, spin tunnel junctions (STJ), and other types of memory cells may be used in the memory array 50.

The memory array 50 can be used in a wide variety of applications. One application may be a computing device having an MRAM storage module. The MRAM storage module may include one or more MRAM memory arrays for long term storage.

MRAM storage modules can be used in devices such as laptop computers, personal computers, and servers.

While the memory device 50 is described with reference to exemplary embodiments, many modifications will be readily apparent to those skilled in the art, and the present disclosure is intended to cover variations thereof.

What is claimed is:

1. A method of reading a memory array, the memory array including a plurality of word lines and a plurality of bit lines, the word lines and bit lines intersecting at a plurality of memory cells, the method comprising:
    applying a read voltage to a selected word line coupled to a selected memory cell;
    coupling a selected bit line coupled to the selected memory cell to a reference potential voltage via a first switch;
    coupling the selected memory cell to a sensing device via a second switch;
    coupling the selected memory cell to a write current source via a third switch;
    opening the first switch to disconnect the selected memory cell from the reference potential voltage; and
    reading a binary state of the selected memory cell using the sensing device.

2. The method of claim 1, wherein the first and second switches are coupled to an end of the selected bit line, the step of opening the first switch comprising:
    opening the first switch after the step of coupling the selected memory cell to the sensing device.

3. The method of claim 2, wherein the step of opening the first switch comprises:
    opening the first switch before the step of reading a binary state of the selected memory cell.

4. The method of claim 3, comprising:
    closing the first switch after the step of reading the binary state of the memory cell.

5. The method of claim 4, comprising:
    opening the second switch after the step of reading the binary state of the memory cell.

6. The method of claim 5, wherein the step of coupling the selected memory cell to a sensing device comprises:
    coupling the selected bit line to the reference potential voltage.

7. The method of claim 6, wherein the reference potential voltage is a ground potential.

8. The method of claim 2, wherein the potential at the end of the selected bit line is substantially unchanged when the selected memory cell is coupled to the sensing device.

9. A memory device, comprising:
    a memory array comprising:
        an array of memory cells;
        a plurality word lines coupled to the memory cells; and
        a plurality of bit lines coupled to the memory cells, wherein the word lines cross the bit lines at the memory cells;
    at least one column write current source selectively coupled to the bit lines;
    at least one row write current source selectively coupled to the word lines;
    a sensing device selectively coupled to the bit lines;
    a first bank of switches selectively coupling the bit lines to a first column write current source;
    a second bank of switches selectively coupling the bit lines to the sensing device;
    a third bank of switches selectively coupling the selected memory cell to a second column write current source; and
    a controller operably coupled to the first and the second bank of switches, the controller controlling read operations of the memory device.

10. The memory device of claim 9, wherein the controller is operatively connected to the first and second banks of switches to maintain ends of the bit lines at a reference potential voltage during read operations.

11. The memory device of claim 10, wherein the reference potential voltage is a ground potential.

12. The memory device of claim 9, comprising:
    a fourth bank of switches selectively coupling the word lines to the row write current source, and selectively coupling a read potential to the word lines.

13. The memory device of claim 12, wherein the controller is operatively connected to the first and second banks of switches to maintain ends of the bit lines at a reference potential voltage during read operations.

14. The memory array of claim 13, comprising:
    a row decoder operably coupled to the controller and to the fourth bank of switches, wherein the row decoder receives address and read/write data from the controller.

15. The memory device of claim 14, comprising:
    a column decoder operably coupled to the controller and to the first and second bank of switches, wherein the column decoder receives address and read/write data from the controller.

16. The memory device of claim 9, wherein the reference potential voltage is a ground potential.

17. A method of reading a memory array, the memory array including a plurality of word lines and a plurality of bit lines, the word lines and bit lines intersecting at a plurality of memory cells, the method comprising:
    applying a read voltage to a selected word line coupled to a selected memory cell;
    coupling the selected memory cell to a reference potential voltage;
    coupling the selected memory cell to a sensing device, wherein the sensing device has a potential substantially identical to the reference potential voltage;

disconnecting the selected memory cell from the reference potential voltage; and reading a binary state of the selected memory cell using the sensing device.

18. The method of claim 17, wherein the potential at the end of the selected bit line is substantially unchanged when the selected memory cell is coupled to the sensing device.

19. The method of claim 17, comprising:

coupling the selected memory cell to the reference potential voltage after the step of reading a binary state of the memory cell.

20. The method of claim 19, comprising:

disconnecting the sensing device from the memory cell after the step of reading the binary state of the memory cell.

21. The method of claim 17, wherein the memory array remains substantially undisturbed from an equipotential state when the selected memory cell is coupled to the sensing device.

* * * * *